United States Patent
Era

(10) Patent No.: US 12,334,340 B2
(45) Date of Patent: Jun. 17, 2025

(54) EPITAXIAL WAFER, SEMICONDUCTOR DEVICE, AND METHOD FOR MANUFACTURING EPITAXIAL WAFER

(71) Applicant: Mitsubishi Electric Corporation, Tokyo (JP)

(72) Inventor: Atsushi Era, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 531 days.

(21) Appl. No.: 17/758,180

(22) PCT Filed: Feb. 17, 2020

(86) PCT No.: PCT/JP2020/005999
§ 371 (c)(1),
(2) Date: Jun. 29, 2022

(87) PCT Pub. No.: WO2021/166024
PCT Pub. Date: Aug. 26, 2021

(65) Prior Publication Data
US 2023/0054861 A1 Feb. 23, 2023

(51) Int. Cl.
*H01L 21/02* (2006.01)
*C30B 25/18* (2006.01)
(Continued)

(52) U.S. Cl.
CPC ...... *H01L 21/02458* (2013.01); *C30B 25/183* (2013.01); *C30B 29/403* (2013.01);
(Continued)

(58) Field of Classification Search
None
See application file for complete search history.

(56) References Cited

U.S. PATENT DOCUMENTS

2006/0054929 A1\* 3/2006 Nakayama ......... H10D 30/4732
257/E29.249
2008/0258135 A1 10/2008 Hoke et al.
(Continued)

FOREIGN PATENT DOCUMENTS

JP 2010-525572 A 7/2010
JP 2011-040766 A 2/2011
(Continued)

OTHER PUBLICATIONS

International Search Report issued in PCT/JP2020/005999; mailed Apr. 28, 2020.

*Primary Examiner* — Erik T. K. Peterson
*Assistant Examiner* — Pinaki Das
(74) *Attorney, Agent, or Firm* — Studebaker Brackett PLLC

(57) ABSTRACT

An epitaxial wafer according to the present disclosure includes: a substrate; a buffer layer formed of a crystal having the composition formula represented by $Al_xGa_yIn_zN$ (x+y+z=1, y>0) on the substrate; a back-barrier layer formed of a crystal having the composition formula represented by $Al_xGa_yIn_zN$ (x+y+z=1, y>0, z>0) on the buffer layer; a channel layer formed of a crystal having the composition formula represented by $Al_xGa_yIn_zN$ (x+y+z=1, y>0) on the back-barrier layer; and an electron-supply layer formed of a crystal having the composition formula represented by $Al_xGa_yIn_zN$ (x+y+z=1, x>0) on the channel layer. The channel layer is constituted with an upper channel layer underneath the electron-supply layer and a lower channel layer on the back-barrier layer, and the lower channel layer has a C concentration higher than the upper channel layer and contains Si.

15 Claims, 8 Drawing Sheets

(51) Int. Cl.
  *C30B 29/40*   (2006.01)
  *H10D 30/47*   (2025.01)
  *H10D 62/85*   (2025.01)

(52) U.S. Cl.
  CPC ...... *C30B 29/406* (2013.01); *H01L 21/02505* (2013.01); *H01L 21/0254* (2013.01); *H01L 21/02576* (2013.01); *H01L 21/02579* (2013.01); *H01L 21/0262* (2013.01); *H10D 30/475* (2025.01); *H10D 62/8503* (2025.01)

(56)            References Cited

U.S. PATENT DOCUMENTS

| | | |
|---|---|---|
| 2011/0240962 A1 | 10/2011 | Ikuta et al. |
| 2012/0025202 A1* | 2/2012 | Makabe ............. H10D 30/4755 257/E29.246 |
| 2014/0015608 A1* | 1/2014 | Kotani ................. H10D 62/357 363/16 |
| 2014/0239311 A1* | 8/2014 | Kawai .................... H10D 30/47 257/76 |
| 2019/0020318 A1 | 1/2019 | Ishiguro et al. |
| 2019/0237550 A1 | 8/2019 | Uesugi et al. |

FOREIGN PATENT DOCUMENTS

| | | |
|---|---|---|
| JP | 2015-177152 A | 10/2015 |
| JP | 2019-021704 A | 2/2019 |
| JP | 2019-134153 A | 8/2019 |

* cited by examiner

EPITAXIAL WAFER, SEMICONDUCTOR DEVICE, AND METHOD FOR MANUFACTURING EPITAXIAL WAFER

TECHNICAL FIELD

The present disclosure relates to an epitaxial wafer and a manufacturing method therefor, and relates to a semiconductor device that is fabricated from the epitaxial wafer.

BACKGROUND ARTS

There has been a semiconductor device that is fabricated from an epitaxial wafer formed of aluminum gallium indium nitride ($Al_xGa_yIn_zN$; $x+y+z=1$, $y>0$) crystals. The epitaxial wafer includes a channel layer that is formed of a crystal having a composition formula represented by $Al_xGa_yIn_zN$ ($x+y+z=1$, $y>0$) and an electron-supply layer that is formed of a crystal having a composition formula represented by $Al_xGa_yIn_zN$ ($x+y+z=1$, $x>0$) on the channel layer. Due to heterojunction of these layers, a highly concentrated two-dimensional electron gas (2DEG) is formed at the interface between these layers. Using the 2DEG as a carrier, the semiconductor device can operate at high output power.

In a semiconductor device such as described above, on the other hand, the high electron density in the 2DEG may in some cases cause a leak current flowing through the buffer layer formed under the channel layer, thus decreasing the high-frequency characteristic. The leak current becomes increasingly pronounced in a case of making the gate length short to obtain a high current-gain cutoff frequency. Against this, the following Patent Document 1 forms a back-barrier layer formed of a crystal having a composition formula represented by $Al_xGa_yIn_zN$ ($x+y+z=1$, $y>0$, $z>0$) between the channel layer and the buffer layer to raise the energy of the conduction band of the buffer layer, thereby suppressing the leak current flowing through the buffer layer.

PRIOR ART DOCUMENT

Patent Document

Patent Document 1: JP2019-21704A

SUMMARY OF THE INVENTION

Problem that the Invention is to Solve

In the epitaxial wafer disclosed in the above Patent Document 1, however, in order to suppress release of In (indium) from the back-barrier layer formed of a crystal having a composition formula represented by $Al_xGa_yIn_zN$ ($x+y+z=1$, $y>0$, $z>0$) and surface roughness associated with the release, a lower channel layer of the channel layer is grown on the back-barrier layer at a low temperature. Consequently, the lower channel layer contains more C (carbon) as an impurity. Since the C becomes an acceptor-type trap, electrons in the 2DEG is trapped by the C, thus raising a problem of occurrence of current collapse.

The present disclosure is made to resolve the above-described problem and is aimed at providing an epitaxial wafer that is capable of suppressing occurrence of current collapse and a method of manufacturing the epitaxial wafer and a semiconductor device fabricated from the epitaxial wafer.

Means for Solving the Problem

An epitaxial wafer according to the present disclosure includes: a substrate; a buffer layer formed of a crystal having a composition formula represented by $Al_xGa_yIn_zN$ ($x+y+z=1$, $y>0$) on the substrate; a back-barrier layer formed of a crystal having a composition formula represented by $Al_xGa_yIn_zN$ ($x+y+z=1$, $y>0$, $z>0$) on the buffer layer; a channel layer formed of a crystal having a composition formula represented by $Al_xGa_yIn_zN$ ($x+y+z=1$, $y>0$) on the back-barrier layer; and an electron-supply layer formed of a crystal having a composition formula represented by $Al_xGa_yIn_zN$ ($x+y+z=1$, $x>0$) on the channel layer. It is characterized in that the channel layer is constituted with an upper channel layer underneath the electron-supply layer and a lower channel layer on the back-barrier layer, and the lower channel layer has a C concentration higher than the upper channel layer and contains Si.

A semiconductor device according to the present disclosure includes: the epitaxial wafer; a source electrode and a drain electrode formed on the electron-supply layer in the epitaxial wafer with a space in between; and a gate electrode formed between the source electrode and the drain electrode on the electron-supply layer.

An epitaxial wafer manufacturing method according to the present disclosure includes: a placing step of placing a substrate in a furnace; a buffer layer forming step of growing on the substrate a buffer layer formed of a crystal having a composition formula represented by $Al_xGa_yIn_zN$ ($x+y+z=1$, $y>0$); a back-barrier layer forming step of growing on the buffer layer a back-barrier layer formed of a crystal having a composition formula represented by $Al_xGa_yIn_zN$ ($x+y+z=1$, $y>0$, $z>0$); a channel layer forming step of growing on the back-barrier layer a channel layer formed of a crystal having a composition formula represented by $Al_xGa_yIn_zN$ ($x+y+z=1$, $y>0$); and an electron-supply layer forming step of growing on the channel layer an electron-supply layer formed of a crystal having a composition formula represented by $Al_xGa_yIn_zN$ ($x+y+z=1$, $x>0$). It is characterized in that in the channel layer forming step, a temperature in the furnace when forming on the back-barrier layer a lower channel layer of the channel layer is set lower than a temperature in the furnace when forming underneath the electron-supply layer an upper channel layer of the channel layer, and in the channel layer forming step, the lower channel layer is doped with Si when forming the lower channel layer.

Advantageous Effect of the Invention

In an epitaxial wafer and a semiconductor device according to the present disclosure, since the lower channel layer contains Si, electrons are supplied from Si to C; accordingly the C is compensated by the Si. Therefore, current collapse can be suppressed. Moreover, in a method of manufacturing the epitaxial wafer according to the present disclosure, since the lower channel layer is doped with Si when formed, electrons are supplied from Si to C in the lower channel layer; accordingly the C is compensated by the Si. Therefore, the epitaxial wafer can be manufactured that is capable of suppressing current collapse.

DETAILED DESCRIPTION OF THE INVENTION

Figure 1:
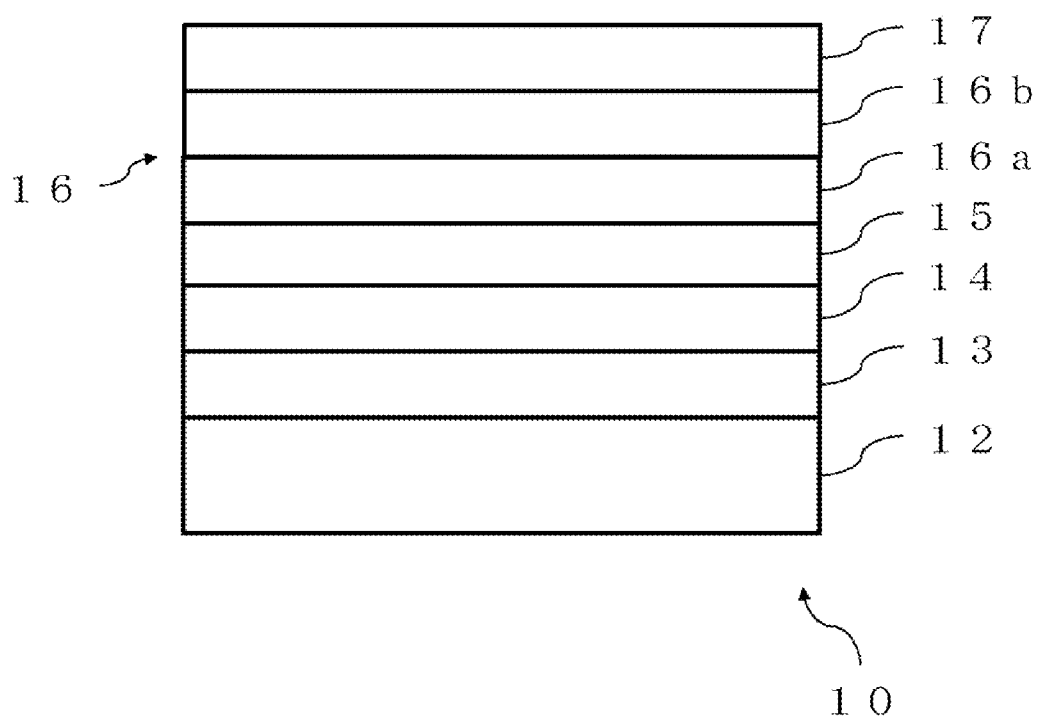
FIG. 1 is a conceptual cross-sectional view of an epitaxial wafer according to Embodiment 1 of the present disclosure.

Hereinafter, Embodiments of the present disclosure are described with reference to the drawings. In the drawings, the same reference numerals represent the same or corresponding parts.

Embodiment 1

The structure of an epitaxial wafer 10 (hereinafter, simply referred to as a wafer 10) according to Embodiment 1 of the present disclosure is described with reference to FIG. 1. The wafer 10 includes a substrate 12 and semiconductor layers formed thereon. The semiconductor layers includes a nucleation layer 13, a buffer layer 14, a back-barrier layer 15, a channel layer 16, and an electron-supply layer 17 in order from the substrate 12. The wafer 10 is a group III-V nitride semiconductor epitaxial wafer having the semiconductor layers that are formed of group-III elements and a group-V element. More specifically, at least one of the semiconductor layers is formed of a gallium nitride crystal having a composition formula represented by $Al_xGa_yIn_zN$ ($x+y+z=1$, $y>0$). The wafer 10 is used for a gallium nitride high electron mobility transistor (GaN-HEMT) of high electron mobility transistors.

The substrate 12 of the wafer 10 is for growing thereon crystals having composition formulas represented by $Al_xGa_yIn_zN$ ($x+y+z=1$) and is formed of silicon carbide (SiC).

The nucleation layer 13 is formed of a crystal having a composition formula represented by AlN on the substrate 12. The nucleation layer 13 is for forming above the substrate 12 the crystals having the composition formula represented by $Al_xGa_yIn_zN$ ($x+y+z=1$, $y>0$). The layer thickness from the interface between the nucleation layer 13 and the substrate 12 to the interface between the nucleation layer 13 and the buffer layer 14 is 50 nm.

The buffer layer 14 is formed of a crystal having a composition formula represented by GaN is on the nucleation layer 13. The buffer layer 14 is for reducing dislocations (crystal defects) occurring in a 2DEG region (the interface between the channel layer 16 and the electron-supply layer 17). While the layer thickness from the interface between the buffer layer 14 and the nucleation layer 13 to the interface between the buffer layer 14 and the back-barrier layer 15 is 1 μm, the buffer layer 14 only needs to have a thickness sufficient to bring about an effect of reducing dislocations.

The back-barrier layer 15 is formed on the buffer layer 14. The back-barrier layer 15 is for bringing about back-barrier effect of raising the conduction band energy in the buffer layer 14. In order to bring about the back-barrier effect, the back-barrier layer 15 is formed of a crystal having a composition formula represented by $Ga_yIn_zN$ ($y+z=1$, $y>0$, $z>0$) (hereafter, simply referred to as InGaN) that has a bandgap narrower than the GaN crystal forming the buffer layer 14. It is known that thus forming on the buffer layer 14 the back-barrier layer 15 having the narrower band gap raises, due to polarization effect, the conduction band energy in the buffer layer 14 toward the interface between the back-barrier layer 15 and the buffer layer. If the In composition ratio in the back-barrier layer 15 is too low, the back-barrier effect is not sufficiently brought about because the band gap difference from the buffer layer 14 becomes small. If the In composition ratio is too high, on the other hand, the crystal quality deteriorates because the crystal is too distorted. In other words, many dislocations in the 2DEG region cause adverse effects such as of reducing electron mobility in the 2DEG. For that reason, the In composition ratio in the InGaN crystal of the back-barrier layer 15 preferably ranges from 3% to 15%, and is 5% in Embodiment 1. Moreover, the back-barrier effect is not sufficiently brought about if the layer thickness from the interface between the back-barrier layer 15 and the buffer layer 14 to the interface between the back-barrier layer 15 and the channel layer 16 is too thick. Contrarily, if the thickness of the back-barrier layer 15 is too thick, its crystal quality deteriorates. Thus, the layer thickness also has a trade-off relationship between the back-barrier effect and the crystal quality. Hence, the thickness of the back-barrier layer 15 preferably ranges from 1 nm to 2 nm, and is 1 nm in Embodiment 1.

As described later, the back-barrier layer 15 is formed by epitaxially growing the InGaN crystal at a temperature in the furnace lower than the buffer layer 14, an upper channel layer 16b of the channel layer 16 underneath the electron-supply layer 17, and the electron-supply layer 17. This is due to the fact that the low temperature growth makes In less prone to be release from the back-barrier layer 15. Note that under this growth condition, since C (carbon) in the furnace is incorporated into the back-barrier layer 15 and less prone to be released thereafter, the back-barrier layer 15 contains C. Specifically, carbon of $3 \times 10^{16}$ atoms/cm$^3$ or more is contained in the back-barrier layer 15 in Embodiment 1. In addition, the C in the furnace is supplied from trimethyl gallium (TMGa:Ga(CH$_3$)$_3$), a Ga source material.

The channel layer 16 is formed on the back-barrier layer 15. The channel layer 16 is a layer in which the carriers run and is formed of a crystal having a composition formula represented by GaN. The reason for using the GaN crystal is that it can be grown as a high-quality crystal. The channel layer 16 is constituted with a lower channel layer 16a on the back-barrier layer 15 and the upper channel layer 16b underneath the electron-supply layer 17. The lower channel layer 16a and the upper channel layer 16b are epitaxially grown under different conditions. The lower channel layer 16a is for covering the back-barrier layer 15 not to release In contained in the back-barrier layer 15 or N bonded with the In. Release of the In or the N from the back-barrier layer 15 is not preferable because the release causes surface roughness and crystal quality deterioration. Since the In or the N is released also during growth of the lower channel layer 16a, the lower channel layer 16a is grown at a temperature lower than the upper channel layer 16b. Consequently, the lower channel layer 16a incorporates much C and has a C concentration higher than the upper channel layer 16b. Specifically, the C concentration in the lower channel layer 16a is 7×10$^{16}$ atoms/cm- or higher in Embodiment 1. Although the C concentration varies depending on the growth condition, the C concentration is at least 5×10$^{16}$ atoms/cm$^3$ or higher. Since the lower channel layer 16a is close to the upper channel layer 16b, which is the region generating the carrier 2DEG, the C containing in the lower channel layer 16a traps electrons in the 2DEG into the acceptor level of the C and the electron density in the 2DEG thereby becomes low, thus resulting in a phenomenon of temporal output reduction of a transistor fabricated from the wafer 10, i.e., causing deterioration of transient response. This phenomenon, which is referred to as "current collapse", prevents the transistor from high power output. Moreover, the transistor that exhibits current collapse has a characteristic of varying its output depending on a power input before, i.e., has a memory effect. This causes a problem in a case of using transistors particularly for wireless communications. For example, in communications via mobile phone base stations, although communication quality is ensured using a distortion compensation technique, signal distortion cannot be sufficiently compensated in a case of a transistor having the memory effect due to current collapse, thus resulting in occurrence of deterioration of communication quality and power emission outside a given bandwidth. The output thereby needs to be limited in order to reduce the influence, thus deteriorating the efficiency. In order to suppress occurrence of current collapse causing such a problem, the lower channel layer 16a of Embodiment 1 is doped with Si when growing; hence it contains Si. Since Si is an n-type dopant and supplies electrons to a trap level caused by the C, trap of electrons by the C in the 2DEG can be prevented, thus being able to suppress current collapse. To sufficiently suppress current collapse, in Embodiment 1, the Si concentration contained in the lower channel layer 16a is higher than the C concentration therein. Specifically, the Si concentration is 8×10$^{16}$ atoms/cm$^3$ or higher in Embodiment 1.

The lower channel layer 16a is not allowed to be formed too thin because it needs to reliably cover the back-barrier layer 15 for In or N not to be released from the back-barrier layer 15. Moreover, if the concentration of electrons running in the lower channel layer 16a cannot be ignored comparing with that of electrons in the 2DEG, the output of the transistor decreases. This is due to the fact that the lower channel layer 16a has lower carrier mobility and the average value of the mobility of the channel layer is thereby reduced because the lower channel layer 16a contains more Si and C while the upper channel layer 16b is formed of an undoped GaN crystal as described later. For that reason, the lower channel layer 16a needs not to be formed too thick. From the above, the layer thickness from the interface between the lower channel layer 16a and the back-barrier layer 15 to the interface between the lower channel layer 16a and the upper channel layer 16b preferably ranges from 1 nm to 20 nm, and the thickness of the lower channel layer 16a is 5 nm in Embodiment 1.

The upper channel layer 16b is for the carriers to run and formed of an undoped GaN crystal so as not to decrease electron mobility. Since incorporation of C is liable to cause the electron mobility to decrease and current collapse to occur, the upper channel layer 16b is grown at a temperature higher than the lower channel layer 16a. While the 2DEG is generated near the interface between the upper channel layer 16b and the electron-supply layer 17, in order to confine most of the 2DEG in the upper channel layer 16b having higher mobility, the upper channel layer 16b needs to be formed thick to a certain extent. Specifically, the layer thickness from the interface between the upper channel layer 16b and the lower channel layer 16a to the interface between the upper channel layer 16b and the electron-supply layer 17 is preferably 5 nm or more. The thickness the upper channel layer 16b is 50 nm in Embodiment 1.

If the channel layer 16 constituted with the lower channel layer 16a and the upper channel layer 16b is formed too thick, the back-barrier layer 15 is too far apart from a gate electrode 23 (described later, see FIG. 3) to be formed above the channel layer 16, thus resulting in that the control by the gate electrode 23 cannot work and an noticeable adverse effect is brought about by electrons running as a leak current in the back-barrier layer 15 whose conduction band becomes low. Hence, the layer thickness from the interface between the back-barrier layer 15 and the channel layer 16 to the interface between the channel layer 16 and the electron-supply layer 17 is preferably 100 nm or less. Even though the layer thickness of 100 nm or less brings the back-barrier layer 15 in close to the gate electrode 23 and a leak current thereby slightly flows near the pinch-off, the back-barrier layer 15 becomes a depletion state at the moment when the voltage applied to the gate electrode is turned off, thus suppressing the leak current. Consequently, the influence of the leak current becomes small and raises no practical problem. The thickness of the channel layer 16 is 55 nm in Embodiment 1. The reason for allowing the channel layer 16 to have a thickness of 100 nm or less is that the lower channel layer 16a contains Si and current collapse can be suppressed even although the lower channel layer 16a becomes close to the 2DEG region. In a case of no doping Si into the lower channel layer 16a, on the other hand, forming the channel layer 16 to have a thickness of 100 nm or less causes current collapse to occur easily because the electrons in the 2DEG is liable to be trapped by the C; hence, the thickness is hardly allowed to be thin. Summarizing the above, it is preferable that the thickness of the channel layer 16 is 100 nm or less, the thickness of the lower channel layer 16a is from 1 nm to 20 nm, and the thickness of the upper channel layer 16b is from 5 nm to 80 nm.

The electron-supply layer 17 is formed of a crystal having a composition formula represented by $Al_xGa_yIn_zN$ (x+y=1, x>0, y>0) (hereafter, referred to as "AlGaN") on the upper channel layer 16b of the channel layer 16. The electron-supply layer 17 is for generating the high-concentration 2DEG near the interface between it and the upper channel layer 16b, and is formed of the AlGaN crystal having a band gap wider than the GaN crystal forming the channel layer 16. The AlGaN crystal generates the 2DEG near the interface between the electron-supply layer 17 and the channel layer 16 by polarization effect. The composition ratio of Al to Ga in the AlGaN crystal of the electron-supply layer 17 and the thickness of the electron-supply layer 17 may be appropriately determined depending on the 2DEG concentration desired to generate. While the 2DEG concentration becomes higher as increasing either composition ratio of Al and thickness of the electron-supply layer 17, there is a trade-off relationship between the concentration and these composition ratio and thickness because increase of the composition ratio and the thickness causes dislocations to occur easily due to crystal distortion. In Embodiment 1, the composition ratios are x=0.25 and y=0.75, and the thickness of the electron-supply layer 17 is 20 nm.

Figure 2:
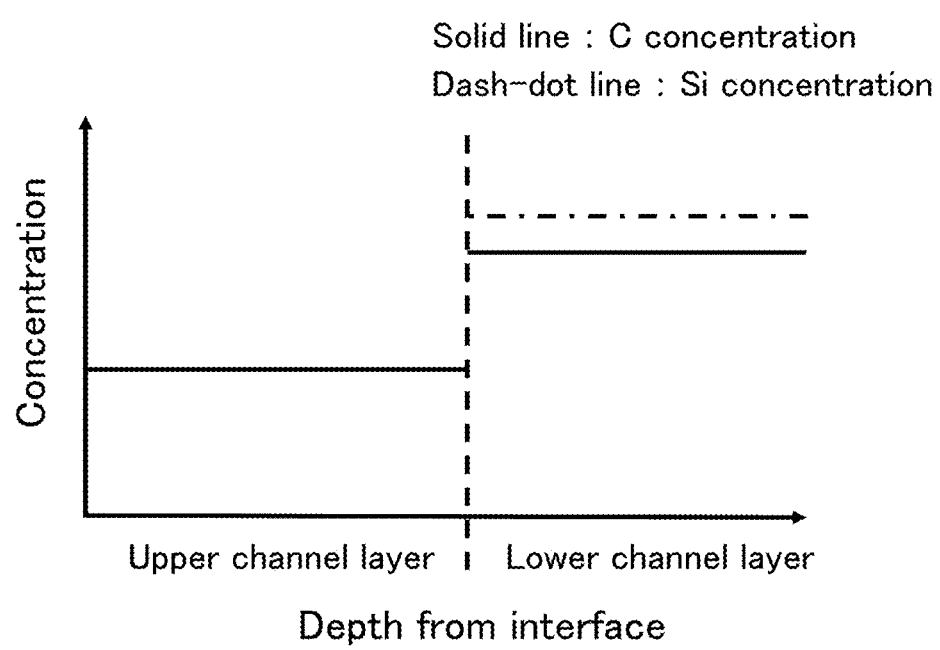
FIG. 2 is a graph illustrating C and Si concentrations versus the depth from an interface in an epitaxial wafer according to Embodiment 1.

The wafer 10 is structured as above. The wafer 10 contains C and Si as described above. The concentrations of these in the channel layer 16 are described with reference to FIG. 2. FIG. 2 is a graph illustrating the concentrations of C and Si on the vertical axis versus the depth from the upper interface in the channel layer 16 on the horizontal axis, in which the horizontal axis leftward from the broken line (the origin point side) represents the formation depth of the upper channel layer 16b and that rightward therefrom represents the formation depth of the lower channel layer 16a. The C concentration is represented by the solid line, and the Si concentration is represented by the dash-dot line. Since the upper channel layer 16b is grown at a temperature higher than the lower channel layer 16a, C is easy to release even though incorporated during the growth, thus resulting in that the C concentration is lower than that in the lower channel layer 16a as shown in FIG. 2. On the other hand, since the lower channel layer 16a is grown at a lower temperature, the C concentration is higher than that in the upper channel layer 16b. Moreover, since the lower channel layer 16a is doped with Si, the Si concentration is higher than the C concentration as shown in FIG. 2. Since the upper channel layer 16b is doped with no Si and contains only a small amount of Si diffused from the lower channel layer 16a, the Si concentration in the upper channel layer 16b is lower than that in the lower channel layer 16a although FIG. 2 does not show the Si concentration (dash-dot line) in the section corresponding to the depth of the upper channel layer 16b.

Figure 3:
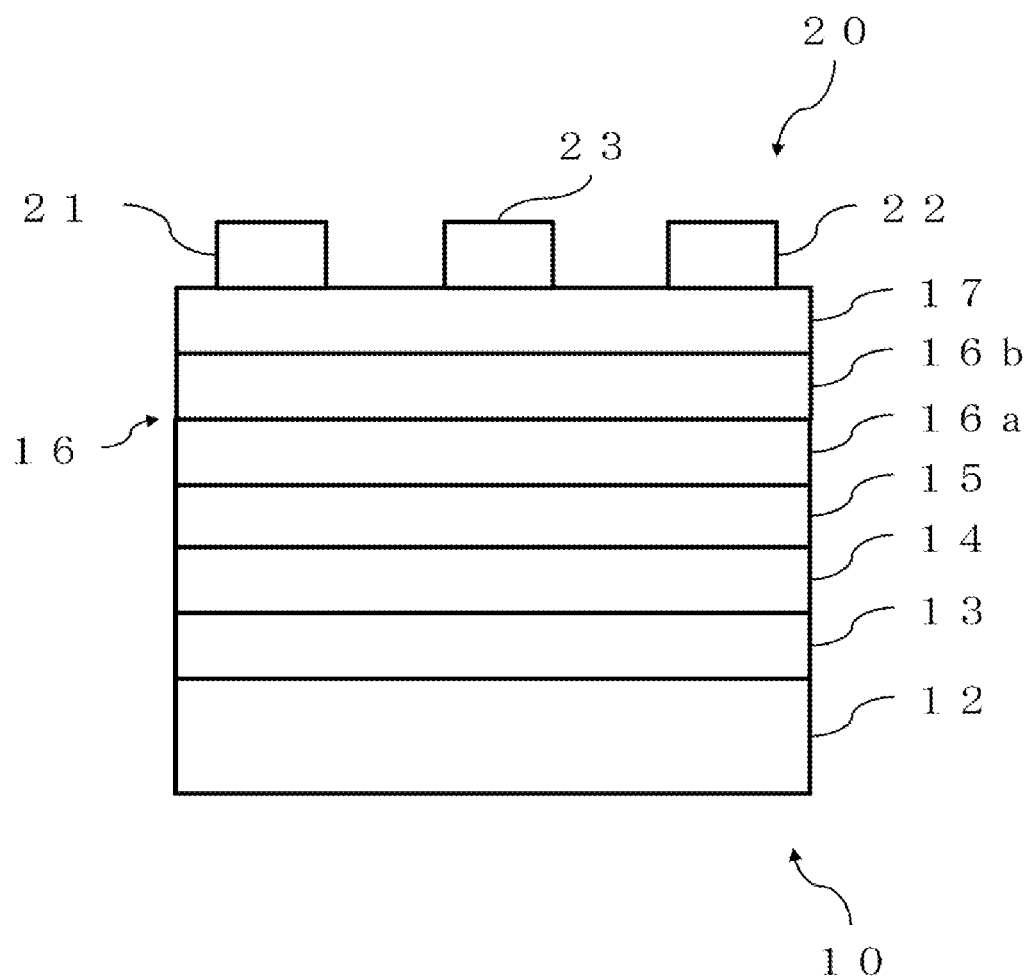
FIG. 3 is a conceptual cross-sectional view of a semiconductor device according to Embodiment 1.

Next, the structure of a semiconductor 20 fabricated from the above described wafer 10 is described with reference to FIG. 3. The semiconductor device 20 is specifically used for a semiconductor element such as (GaN-HEMT) of high electron mobility transistors. The semiconductor device 20 includes the wafer 10, a source electrode 21, a drain electrode 22, and a gate electrode 23. The source electrode 21 and the drain electrode 22 are formed with a space in between on the top surface of the wafer 10, i.e., on the surface of the electron-supply layer 17 opposite to the substrate 12. The source electrode 21 and the drain electrode 22 constituted with lower layers formed of Ti (Titanium) on the electron-supply layer 17 and upper layers formed of Al opposite thereto, and the thicknesses of the lower layers are about 20 nm and the thicknesses of the upper layers are about 200 nm. The source electrode 21 and the drain electrode 22 are in ohmic contact with the electron-supply layer 17. Moreover, the gate electrode 23 is formed between the source electrode 21 and the drain electrode 22, and in contact with the electron-supply layer 17. The gate electrode 23 is constituted with a lower layer formed of Ni (nickel) on the electron-supply layer 17 and an upper layer formed of Au opposite to the electron-supply layer 17, and the thickness of the lower layer is about 30 nm and that of upper layer is about 400 nm. Note that although omitted in FIG. 3, the semiconductor device 20 has wirings connected with the source electrode 21, the drain electrode 22, and the gate electrode 23. In addition, Ar (argon) or the like is injected into the lateral sides of the wafer 10, i.e., the sides of the wafer 10 parallel to the arrangement direction from the substrate 12 to the electron-supply layer 17, to form inactive regions.

Figure 4:
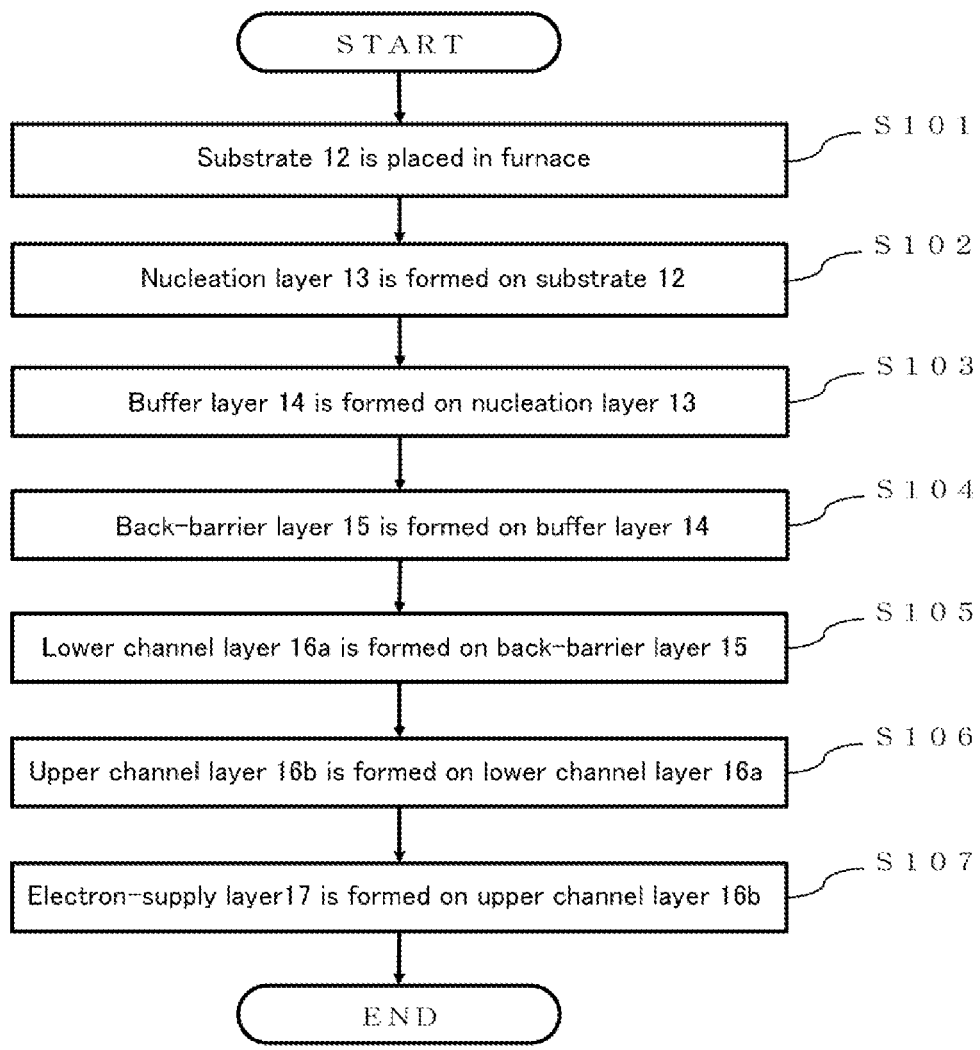
FIG. 4 is a flowchart showing an epitaxial wafer manufacturing method according to Embodiment 1.

Next, a method of manufacturing the above-mentioned wafer 10 is described with reference to the flowchart shown in FIG. 4. Note that each layer of the wafer 10 is formed by a metal organic chemical vapor deposition (MOCVD).
(Placing Step)
First, the substrate 12 is placed in the furnace for epitaxially growing the wafer 10 (Step S101).
(Nucleation Layer Forming Step)
Next, a mixture of trimethyl aluminum (TMA:Al(CH$_3$)$_3$) gas and ammonia gas is introduced into the furnace, and the AlN crystal is grown to 50 nm on the substrate 12 to form the nucleation layer 13 thereon (Step S102).

(Buffer Layer Forming Step)
Next, a mixture of TMGa gas and ammonia gas is introduced into the furnace, and the GaN crystal is grown to 1 μm on the nucleation layer 13 to form the undoped buffer layer 14 thereon (Step S103). During this, the temperature in the furnace is set to 1100° C. and the pressure therein is set to 200 mbar, and the V/III ratio (the value of the molar flow rate of the group V material fed into the furnace divided by the molar flow rate of the group III material fed thereinto) of the mixture gas is set to 500. Hydrogen gas is used as a carrier gas.
(Back-Barrier Layer Forming Step)
Next, a mixture of trimethyl indium (TMI:In(CH$_3$)$_3$) gas, TMGa gas, and ammonia gas is introduced into the furnace, and the InGaN crystal is grown to 1 nm on the buffer layer 14 to form the back-barrier layer 15 thereon (Step S104). During this, the temperature, the pressure, and the V/III ratio in the furnace are set to 800° C., 400 mbar, and 50000. Nitrogen gas is used as the carrier gas. The back-barrier layer 15 is grown under the condition of lower temperature, higher pressure, and higher V/III ratio compared with the nucleation layer 13, the later-described upper channel layer 16b, and the electron-supply layer 17. This is due to the fact that In is incorporated into the back-barrier layer 15 and less prone to release.
(Lower Channel Layer Forming Step)
Next, a mixture of TMGa gas, monosilane gas, and ammonia gas is introduced in the furnace, and the GaN crystal doped with Si is grown to 5 nm on the back-barrier layer 15 to form the lower channel layer 16a thereon (Step S105). During this, the temperature, the pressure, and the V/III ratio in the furnace are set to 800° C., 200 mbar, and 500. Hydrogen gas is also used as the carrier gas. Since increasing the temperature in the furnace in the lower channel layer forming step may sometimes release In or N from the surface of the back-barrier layer 15 and cause surface roughness, the lower channel layer is grown under the lower temperature condition compared with the nucleation layer 13, the later described upper channel layer 16b, and electron-supply layer 17. Generally, after an InGaN crystal is grown, the temperature cannot be allowed to raise until the InGaN crystal is protected by a material such as GaN containing no In. However, growing the GaN crystal under the lower temperature condition incorporates more C contained in the TMGa gas into the lower channel layer and the C is less prone to release. Since the C becomes an acceptor and traps electrons in the 2DEG and thereby causes the transient response to deteriorate, the lower channel layer 16a is doped with Si in the lower channel layer forming step of Embodiment 1. The Si can fill the trap level of C with electrons by increasing the doped Si concentration higher than the concentration of C contained in the lower channel layer 16a; hence, the amount of monosilane gas in the mixture gas is adjusted so as to increase the Si concentration in lower channel layer 16a higher than the C concentration therein.
(Channel Layer Forming Step)
Next, a mixture of TMGa gas and ammonia gas is introduced into the furnace, and the undoped GaN crystal is grown to 50 nm on the lower channel layer 16a to form the upper channel layer 16b thereon (Step S106). During this, the temperature, the pressure, and the V/III ratio in the furnace are set to 1100° C., 200 mbar, and 500. Hydrogen gas is also used as the carrier gas. When the upper channel layer 16b is formed, the surface of the back-barrier layer 15 is covered with the lower channel layer 16a. Consequently, the problem of releasing the In or the N is hardly to raise even though the temperature condition for growing the upper channel layer 16b is set higher than that for growing the lower channel layer 16a. Setting higher the temperature condition for the growth is preferable from the viewpoint of improving the carrier mobility because C is less prone to be incorporated into the upper channel layer 16b. For that reason, the temperature in the furnace in the upper channel layer forming step is set higher than that in the lower channel layer forming Step.

Figure 5:
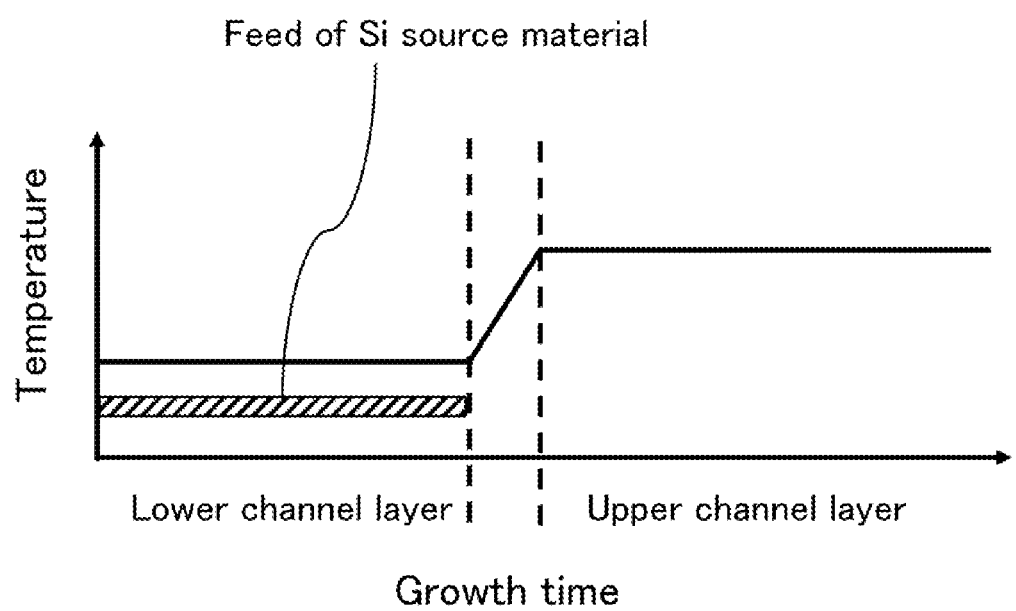
FIG. 5 is graph illustrating a temperature in the furnace versus the growth time in a channel layer forming step in the epitaxial wafer manufacturing method according to Embodiment 1.

Here, the lower channel layer forming step and the upper channel layer forming step are collectively referred to simply as "channel layer forming step". The relationship between the growth time and the temperature in the furnace in the channel layer forming step and the timing of doping Si are described with reference to FIG. 5. The graph shown in FIG. 5 illustrates the temperature in the furnace on the vertical axis versus the growth time on the horizontal axis, in which the origin point of the horizontal axis represents the time of starting growth of the lower channel layer 16a. And, the section between the origin point and the left broken line corresponds to the growth time in the lower channel layer forming step, and the section rightward from the right broken line corresponds to the growth time in the upper channel layer forming step. As shown in FIG. 5, the temperature in the furnace during formation of the lower channel layer 16a and the temperature in the furnace during formation of the upper channel layer 16b are different: the former is lower than the latter as described before. While the monosilane gas, the Si source material, is fed during the lower channel layer forming step, it is not fed after the lower channel layer forming step is finished. In addition, while a period for pausing the growth is provided between the lower channel layer forming step and the upper channel layer forming step (the section between the left broken line and the right broken line) to raise the temperature in the furnace in the meanwhile as shown in FIG. 5, the channel layer 16 (referred to as "interlayer") may be grown during the period. In this case, the interlayer growing under a condition in which the temperature in the furnace is insufficiently raised contains C, and the C concentration decreases gradually as the temperature raises. For that reason, the feed of the monosilane gas, the Si source material, which feed is continued during the lower channel layer forming step, is gradually reduced, whereby the C can be compensated by the Si.

Referring back to FIG. 4, an electron-supply layer forming step subsequent to the upper channel layer forming step (Step S106) is described.

(Electron-Supply Layer Forming Step)

A mixture of TMA gas, TMGa gas, and ammonia gas is introduced into the furnace, and the AlGaN crystal is grown to 20 nm on the upper channel layer 16b to form the electron-supply layer 17 thereon (Step S107). During this, the temperature, the pressure, and the V/III ratio in the furnace are set to 1100° C., 50 mbar, and 1000. Hydrogen gas is used as the carrier gas. The wafer 10 is manufactured in the way described above.

Next, a description is made on a method of manufacturing the semiconductor 20 from the wafer 10 manufactured in the above way. First, a resist mask for forming the source electrode 21 and the drain electrode 22 is formed on the electron-supply layer 17 of the wafer 10. Specifically, a resist is applied to the electron-supply layer 17, and then openings are formed in the resist at areas for forming the electrodes. Next, Ti and Al are deposited by an evaporation process to 20 nm and 200 nm on the resist including the inside of openings for the Ti and the Al to become the lower layers and the upper layers, respectively, and then the resist mask, and the Ti and the Al deposited thereon are removed by a lift-off process. After that, the wafer 10 is thermally treated at 600° C. in, for example, a nitrogen atmosphere to establish ohmic contact between the Ti, the Al, and the electron-supply layer 17. The source electrode 21 and the drain electrode 22 are formed in this way. And then, a resist mask for forming the gate electrode 23 is formed on the electron-supply layer 17 of the wafer 10. Specifically, a resist is applied to the electron-supply layer 17, and then an opening for forming the gate electrode 23 is formed in the resist at an area between the source electrode 21 and drain electrode 22 by a photolithography process. Next, Ni and Au are deposited by an evaporation process to 30 nm and 400 nm on the resist including the inside of opening for the Ni and the Au to become the lower layer and the upper layer, respectively, and then the resist mask, and the Ni and the Au deposited thereon are removed by a lift-off process. In this way, the gate electrode 23 is formed between the source electrode 21 and the drain electrode 22. In addition, the connection of the wirings to each electrode and formation of the inactive regions are performed using a known method.

The wafer 10 and the method of manufacturing the semiconductor device 20 and the wafer 10, according to Embodiment 1 of the present disclosure are constituted and implemented as described above; hence the following effects are brought about. In the wafer 10 and the semiconductor device 20 according to Embodiment 1 of the present disclosure, the lower channel layer 16a, which is near the 2DEG generating region and has the high concentration of C, is doped with the n-type dopant Si. The Si supplies electrons to the trap level of the C for the electrons in the 2DEG not to be trapped. Consequently, the wafer 10 and the semiconductor device 20 are capable of preventing the carrier density from being decreased by trapping electrons in the 2DEG by the C. In other words, occurrence of current collapse can be suppressed. Moreover, since current collapse can be suppressed, the wafer 10 and the semiconductor device 20 are capable of suppressing deterioration of the transient response characteristic, thus allowing the semiconductor device 20 to use at a high power output (near the saturation output).

The Si atom acts as a donor for supplying one electron, and the contained C atom acts as an acceptor receiving one electron. For that reason, if the concentration of Si contained in the lower channel layer 16a is lower than that of C contained therein, the electron cannot be supplied to every C atom. In the wafer 10 and the semiconductor device 20 according to Embodiment 1 of the present disclosure, the concentration of Si contained in the channel layer 16 is higher than that of C contained therein. As a result, it is possible to prepare the electron to be supplied to every C atom, thus being able to suppress reliably occurrence of current collapse.

In the wafer 10 and the semiconductor device 20 according to Embodiment 1 of the present disclosure, occurrence of current collapse is suppressed by doping Si into the lower channel layer 16a and occurrence of leak current is suppressed by forming the channel layer to have a thickness of 100 nm or less to bring the back-barrier layer 15 in close to the gate electrode 23. Accordingly, the occurrence of both leak current and current collapse can be suppressed.

The upper channel layer 16b is a layer for the 2DEG carrier to run. Since much impurities contained in the upper channel layer 16b decreases the carrier mobility, the impurity concentration in the upper channel layer 16b is preferably low. In the wafer 10 and the semiconductor device 20 according to Embodiment 1 of the present disclosure, since the upper channel layer 16b is grown at a temperature higher than the lower channel layer 16a, the C concentration in the upper channel layer 16b is lower than that in lower channel layer 16a. Accordingly, the carrier mobility can be improved.

Also, the method of manufacturing the wafer 10, according to Embodiment 1 of the present disclosure can manufacture the wafer 10 that brings about the effect described above.

Here, a description and a supplemental description are made on modifications of the wafer 10 and method of manufacturing the semiconductor device 20 and the wafer 10, according to Embodiment 1 of the present disclosure. While in Embodiment 1 of the present disclosure, the wafer 10 includes the substrate 12, the nucleation layer 13, the buffer layer 14, the back-barrier layer 15, the channel layer 16, and the electron-supply layer 17 in order from below, an additional layer may be added between successive ones of these layers as long as it can exhibit the above-described effect and acts as a GaN-HEMT. While in the description of Embodiment 1, the nucleation layer 13 is grown on the substrate 12 and the buffer layer 14 is grown on the nucleation layer 13, in the case of adding an additional layer, for example, the nucleation layer 13 may be grown on the substrate 12 via an additional layer and the buffer layer 14 may be grown on the nucleation layer 13 via another additional layer. Moreover, a layer among the above layers may be omitted. For example, formation of the nucleation layer 13 is omitted and the buffer layer may be grown directly on the substrate 12. As an example of adding an additional layer, a material such as SiN is grown on the substrate 12 and then the nucleation layer 13 may be grown. Furthermore, a layer formed of a high-resistance GaN crystal doped with Fe (ferrum) and C may be grown between the buffer layer 14 and the nucleation layer 13. In this case, the thicknesses of the buffer layer 14 and the layer formed of the high-resistance GaN crystal only need to be adjusted appropriately. In addition, in the case of doping Fe, ferrocene can be used as a source material therefor. Furthermore, a cap layer formed of a GaN crystal may be grown between the electron-supply layer 17 and each electrode.

The substrate 12, while formed of SiC in Embodiment 1, may be formed of silicon (Si), sapphire, gallium arsenide (GaAs), and zinc oxide (ZnO) instead of SiC. The nucleation layer 13, while formed of the AlN crystal in Embodiment 1, may be formed of a crystal other than that of AlN as long as the crystal having a composition formula represented by $Al_xGa_yIn_zN$ (x+y+z=1, y>0) can be formed on the nucleation layer 13. For example, the nucleation layer may be formed of a crystal having a composition formula represented by $Al_xGa_yIn_zN$ (x+y+z=1). Further, the nucleation layer 13 may be constituted with multilayer different in the composition ratio. In this case, the composition formula of each layer can be represented by $Al_xGa_yIn_zN$ (x+y+z=1). In addition, while the thickness of the nucleation layer 13 is set to 50 nm, it only needs to have a thickness that can grow the crystal(s) of the upper layer(s) on the nucleation layer 13 with high quality.

While the buffer layer 14 is formed of the GaN crystal in Embodiment 1, it may be formed of a crystal of other than GaN as long as dislocations occurring in the 2DEG region can be reduces. For example, the layer may be formed of a crystal having a composition formula represented by $Al_xGa_yIn_zN$ (x+y+z=1, y>0). While the back-barrier layer 15 is formed of the InGaN crystal in Embodiment 1, it may be formed of a crystal other than InGaN as long as a back-barrier effect can be brought about. For example, the back-barrier layer may be formed of a crystal having the composition formula represented by $Al_xGa_yIn_zN$ (x+y+z=1, y>0, z>0).

While the channel layer 16 is formed of the GaN crystal in Embodiment 1, the layer may be formed of a crystal other than GaN as long as the 2DEG can be generated. For example, the channel layer may be formed of a crystal having a composition formula represented by $Al_xGa_yIn_zN$ (x+y+z=1, y>0). While the electron-supply layer 17 is formed of the AlGaN crystal in Embodiment 1, the layer may be formed of a crystal other than AlGaN as long as 2DEG can be generated in the channel layer 16. For example, the electron-supply layer may be formed of a crystal having a composition formula represented by $Al_xGa_yIn_zN$ (x+y+z=1, x>0). More specifically, a crystal such as $Al_xIn_zN$ (x+z=1, x>0, z>0) and $Al_xGa_yIn_zN$ (x+y+z=1, x>0, y>0, z>0) can be used.

In Embodiment 1, while nitrogen gas is used as the carrier gas when growing the back-barrier layer 15 and hydrogen gas is used as the carrier gas when growing the other layers, another carrier gas may be used.

While Embodiment 1 describes the example that the concentration of Si contained in the lower channel layer 16a is higher than that of C contained therein, even though the Si concentration is lower than the C concentration, the Si can compensate part of the C, thus being able to suppress current collapse.

While the source electrode 21 and the drain electrode 22 are formed of Ti and Al and the gate electrode 23 is formed of Ni and Au in Embodiment 1, the electrode materials are not limited to these but known materials can be used. And, the structures and thicknesses of the electrodes may be appropriately determined.

Embodiment 2

Next, Embodiment 2 of the present disclosure is described. Descriptions of the same points of the structure and the manufacturing method described in Embodiment 1 are omitted, and points different from Embodiment 1 are described below. Note that a wafer 10 and a method of manufacturing a semiconductor device 20 and the wafer 10, according to Embodiment 2 may be constituted and implemented with combination of the modification of Embodiment 1. In Embodiment 1, the pressure in the furnace when growing the GaN crystal for the lower channel layer 16a is set to 200 mbar as with the case of the upper channel layer 16b. In contrast to this, in Embodiment 2, the pressure in the furnace when growing the GaN crystal for the lower channel layer 16a is set lower than the pressure in the furnace when growing the GaN crystal for the upper channel layer 16b.

The wafer 10 and the semiconductor device 20 of Embodiment 2 include the lower channel layer 16a formed of the GaN crystal grown at a lower pressure. Since growing the GaN crystal at the lower pressure increases incorporation of C, the lower channel layer 16a has a C concentration higher than the case with Embodiment 1. Specifically, the C concentration is $1.1 \times 10^{17}$ atoms/cm$^3$ or higher. Correspondingly to the C concentration, the lower channel layer is doped with more Si than the case with Embodiment 1; hence, the Si concentration therein is also higher than the case with Embodiment 1. Specifically, the Si concentration is $1.2 \times 10^{17}$ atoms/cm$^3$ or higher.

Figure 6:
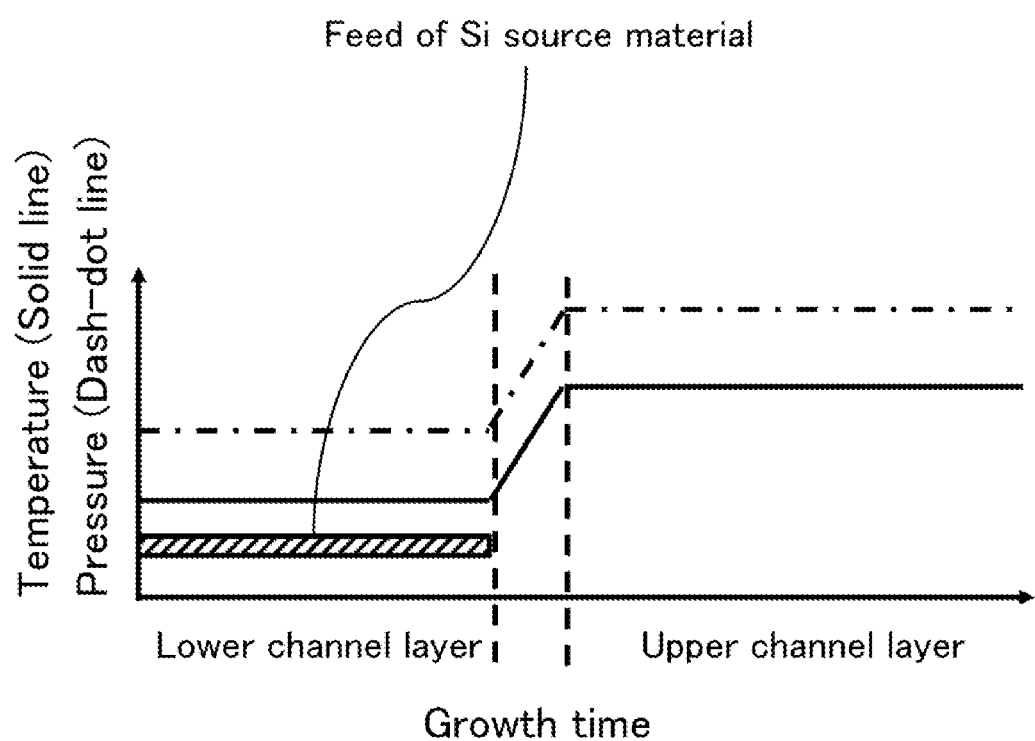
FIG. 6 is a graph illustrating a temperature and a pressure in the furnace versus the growth time in a channel layer forming step in an epitaxial wafer manufacturing method according to Embodiment 2 of the present disclosure.

In the lower channel layer forming step in the method of manufacturing the wafer 10, according to Embodiment 2, the GaN crystal is grown in the furnace at a temperature of 800° C., a pressure of 50 mbar, and a V/III ratio of 500. That is, in the lower channel layer forming step, the pressure in the furnace when forming the lower channel layer 16a is set lower than that in the furnace when forming the upper channel layer 16b. Incidentally, the pressure in the furnace when forming the upper channel layer 16b is 200 mbar. Here, a description is made, with reference to FIG. 6, of how the temperature and the pressure in the furnace are changed during formation of the channel layer 16. The graph shown in FIG. 6 illustrates the temperature and the pressure in the furnace on the vertical axis versus the growth time on the horizontal axis, in which the origin point of the horizontal axis represents the time of starting growth of the lower channel layer 16a. And, the section between the origin point and the left broken line corresponds to the growth time in the lower channel layer forming step, and the section rightward from the right broken line corresponds to the growth time in the upper channel layer forming step. As shown in FIG. 6, the temperature and the pressure in the furnace during formation of the lower channel layer 16a and the temperature and the pressure in the furnace during formation of the upper channel layer 16b are different: the former is lower than the latter as described before. In addition, while a period for pausing the growth is provided between the lower channel layer forming step and the upper channel layer forming step (the section between the left broken line and the right broken line) to raise the temperature and pressure in the furnace in the meanwhile as shown in FIG. 6, the channel layer 16 (referred to as "interlayer") may be grown during the period as with Embodiment 1. In this case, the feed of the monosilane gas, the Si source material, which feed is continued during the lower channel layer forming step, is gradually reduced, whereby the C can be compensated by the Si.

The wafer 10 and the method of manufacturing the semiconductor device 20 and the wafer 10, according to Embodiment 2 of the present disclosure are constituted and implemented as described above; hence the following effects are brought about. Generally, growing a GaN crystal at a low temperature poses a problem of incorporating much C and a problem of deteriorating flatness of the lower channel layer 16a because the surface migration length of Ga is reduced. If flatness of the lower channel layer 16a deteriorates, the flatness cannot be sufficiently recovered because the upper channel layer 16b has a thickness of only about several tens of nm. As a result, flatness of the interface between the upper channel layer 16b and the electron-supply layer 17 deteriorates, thus decreasing 2DEG mobility. In the method of manufacturing the wafer 10, according to Embodiment 2 of the present disclosure, the GaN crystal is grown at a lower pressure in the lower channel lower forming step than in the upper channel lower forming step. Although growing the GaN crystal at the lower pressure increases incorporation of C, occurrence of current collapse can be suppressed because the lower channel layer 16a is doped with Si. Moreover, by decreasing the pressure in the lower channel layer forming step, the surface migration length of Ga can be increased, thereby suppressing deterioration of the flatness. Thus, Embodiment 2 can suppress both occurrence of current collapse and deterioration of the flatness (decrease in the mobility). Moreover, since the wafer 10 and the semiconductor device 20 according to Embodiment 2 of the present disclosure are manufactures as described above, occurrence of current collapse can be suppressed and output of the semiconductor device 20 can be prevented from reduction caused by decrease in 2DEG mobility due to deterioration of the flatness.

Embodiment 3

Next, Embodiment 3 of the present disclosure is described. Descriptions of the same points of the structure and the manufacturing method described in Embodiment 1 are omitted, and points different from Embodiment 1 are described below. Note that a wafer 10 and a method of manufacturing the semiconductor device 20 and the wafer 10, according to Embodiment 3 may be constituted and implemented with combination of modifications of Embodiment 1 or with combination of Embodiment 2. In Embodiment 1, the V/III ratio in the furnace when growing the GaN crystal for the lower channel layer 16a is set to 500 as with the case of the upper channel layer 16b. In contrast to this, in Embodiment 3, the V/III ratio in the furnace when growing the GaN crystal for the lower channel layer 16a is set lower than the V/III ratio in the furnace when growing the GaN crystal for the upper channel layer 16b.

The wafer 10 and the semiconductor device 20 of Embodiment 3 include the lower channel layer 16a formed of the GaN crystal grown at a low V/III ratio. Since growing the GaN crystal at the low V/III ratio increases incorporation of C, the lower channel layer 16a has a C concentration higher than the case with Embodiment 1. Specifically, the C concentration is $1.1 \times 10^{17}$ atoms/cm$^3$ or higher. Correspondingly to the C concentration, the lower channel layer is doped with more Si than the case with Embodiment 1; hence, the Si concentration therein is also higher than the case with Embodiment 1. Specifically, the Si concentration is $1.2 \times 10^{17}$ atoms/cm$^3$ or higher.

Figure 7:
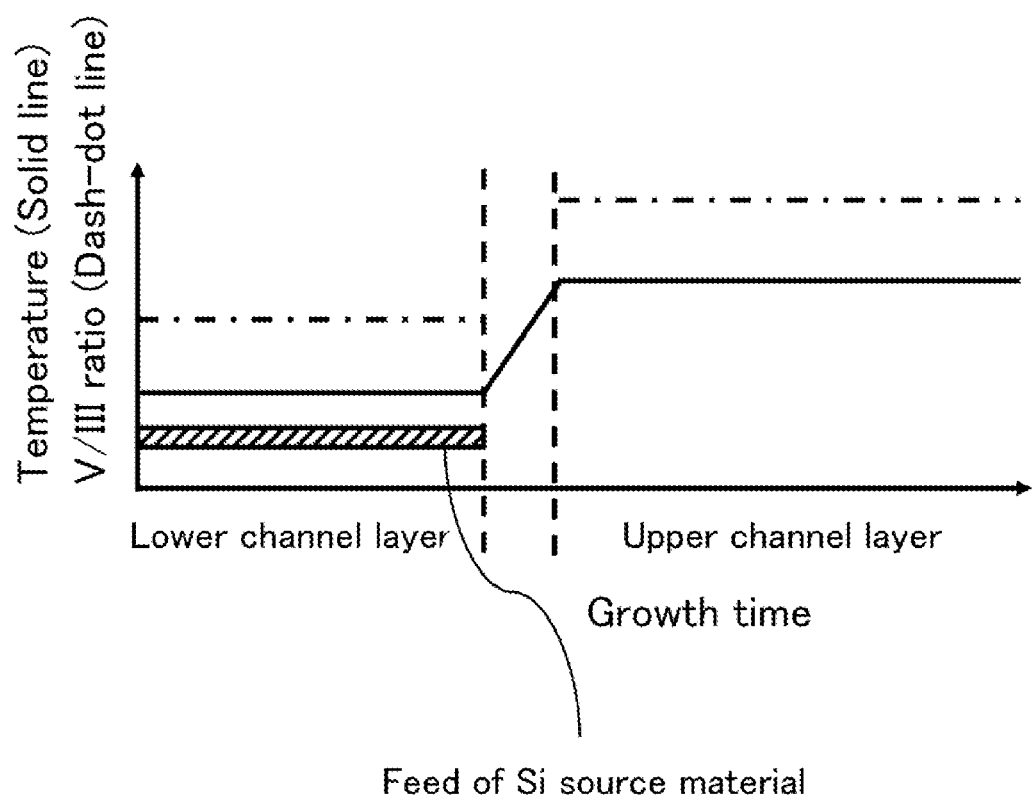
FIG. 7 is a graph showing a temperature and a V/III ratio in the furnace versus the growth time in a channel layer forming step in an epitaxial wafer manufacturing method according to Embodiment 3 of the present disclosure.

In the lower channel layer forming step in the method of manufacturing the wafer 10, according to Embodiment 3, the GaN crystal is grown in the furnace at a temperature of 800° C., a pressure of 200 mbar, and a V/III ratio of 200. That is, in the lower channel layer forming step, the V/III ratio in the furnace when forming the lower channel layer 16a is set lower than that in the furnace when forming the upper channel layer 16b. Incidentally, the V/III ratio in the furnace when forming the upper channel layer 16b is 500. Here, description is made, with reference to FIG. 7, of how the temperature and the V/III ratio in the furnace are changed during formation of the channel layer 16. The graph shown in FIG. 7 illustrates the temperature and the V/III ratio in the furnace on the vertical axis versus the growth time on the horizontal axis, in which the origin point of the horizontal axis represents the time of starting growth of the lower channel layer 16a. And, the section between the origin point and the left broken line corresponds to the growth time in the lower channel layer forming step, and the section rightward from the right broken line corresponds to the growth time in the upper channel layer forming step. As shown in FIG. 7, the temperature and the V/III ratio in the furnace during formation of the lower channel layer 16a are different from those in the furnace during formation of the upper channel layer 16b: the former is lower than the latter as described before. In addition, a period for pausing the growth is provided between the lower channel layer forming step and the upper channel layer forming step (the section between the left broken line and the right broken line) to raise the temperature in the furnace in the meanwhile as shown in FIG. 7. Note that since the GaN crystal is not grown during the period, no source materials therefor is fed. For that reason, the V/III ratio is not depicted because it cannot be defined. Also in Embodiment 3, the channel layer 16 (referred to as "interlayer") may be grown during the pause of the growth as with Embodiment 1. In this case, the V/III ratio is gradually increased and the feed of the monosilane gas, the Si source material, which feed is continued during the lower channel layer forming step, is gradually reduced, whereby the C can be compensated by the Si.

The wafer 10 and the method of manufacturing the semiconductor device 20 and the wafer 10, according to Embodiment 3 of the present disclosure are constituted and implemented as described above; hence the following effects are brought about. As described in Embodiment 2, growing a GaN crystal at a low temperature increases incorporation of C, and reduces the surface migration length of Ga and deteriorates the flatness, thus causing a problem of decreasing 2DEG mobility. In the method of manufacturing the wafer 10, according to Embodiment 3 of the present disclosure, the GaN crystal is grown in the lower channel layer forming step at a V/III ratio lower than in the upper channel lower forming step. Although growing the GaN crystal at the lower V/III ratio increases incorporation of C, since the lower channel layer 16a is doped with Si, occurrence of current collapse can be suppressed. Moreover, by decreasing the V/III ratio, the surface migration length of Ga can be increased, thereby being able to suppress deterioration of the flatness. Thus, Embodiment 3 can suppress both occurrence of current collapse and deterioration of the flatness (decrease in the mobility). Moreover, since the wafer 10 and the semiconductor device 20 according to Embodiment 3 of the present disclosure is manufactured as described above, occurrence of current collapse can be suppressed and output of the semiconductor device 20 can be prevented from reduction caused by decrease in 2DEG mobility due to deterioration of the flatness.

As described above, while in the manufacturing method of Embodiment 3, the lower channel layer forming step is performed at a high pressure as with Embodiment 1, the forming step may be performed at a low pressure as with Embodiment 2.

Embodiment 4

Next, Embodiment 4 of the present disclosure is described. Descriptions of the same points of the structure and the manufacturing method described in Embodiment 1 are omitted, and points different from Embodiment 1 are described below. Note that a wafer 10 and a method of manufacturing the semiconductor device 20 and the wafer 10, according to Embodiment 4 may be constituted and implemented with combination of the modifications of Embodiment 1 or with combination of Embodiment 2 or Embodiment 3. In Embodiment 4, not only the lower channel layer 16a but also the back-barrier layer 15 are doped with Si.

The wafer 10 and the semiconductor device 20 according to Embodiment 34 include the back-barrier layer 15 containing Si. The back-barrier layer 15 also contains C because it is formed at a low temperature and C is incorporated into the layer and less prone to release as with the lower channel layer 16a. The concentration of Si contained in the back-barrier layer 15 is higher than the concentration of C contained therein. Specifically, the C concentration is $5 \times 10^{16}$ atoms/cm$^3$ or higher, and the Si concentration is $6 \times 10^{16}$ atoms/cm$^3$ or higher.

Figure 8:
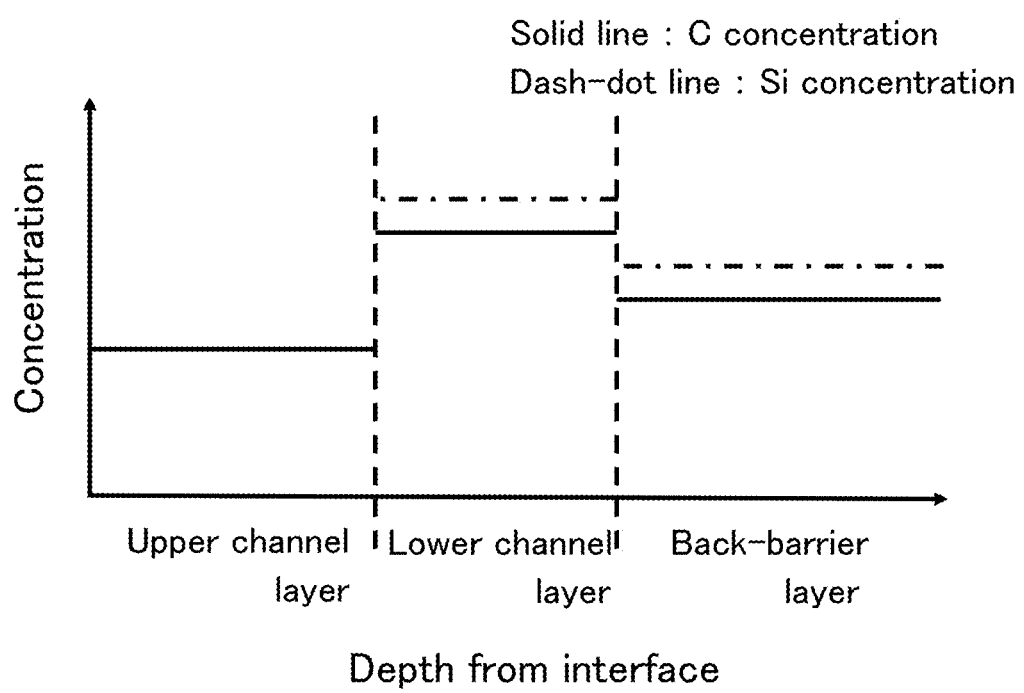
FIG. 8 is a graph illustrating C and Si concentrations versus the depth from an interface in an epitaxial wafer according to Embodiment 3 of the present disclosure.

The method of manufacturing the wafer 10, of Embodiment 3 is different from the manufacturing method of Embodiment 1 in that in the back-barrier layer forming step, a mixture of trimethyl indium (TMI: In(CH$_3$)$_3$) gas, TMGa gas, and ammonia gas containing monosilane gas is introduced into the furnace and a InGaN crystal for forming the back-barrier layer 15 is grown to 1 nm on the buffer layer 14 to form the back-barrier layer 15 doped with Si on the buffer layer 14. The concentrations of C and Si in the back-barrier layer 15 and the channel layer 16 are described here with reference to FIG. 8. The graph shown in FIG. 8 illustrates the concentrations on the vertical axis versus the depth from the surface on the horizontal axis. The section from the origin point to the left broken line corresponds to the depth of the upper channel layer 16b; the section from the left broken line to the right broken line corresponds to the depth of the lower channel layer 16a; and the section rightward from the right broken line corresponds to the depth of the back-barrier layer 15. The C concentration is represented by the solid line, and the Si concentration is represented by the dash-dot line. As shown in FIG. 8, since C is more incorporated into the lower channel layer 16a and the back-barrier layer 15 formed by growing the respective crystals of GaN and InGaN at a lower temperature, the C concentrations therein are higher than that in the upper channel layer 16b. Moreover, the back-barrier layer 15, since it is formed at a higher pressure and a higher V/III ratio than the lower channel layer 16a, has a C concentration lower than the lower channel layer 16a. The Si concentrations in the lower channel layer 16a and the back-barrier layer 15 are higher than the C concentrations therein. Note that while in FIG. 8, the C and Si concentrations in the lower channel layer 16a are higher than those in the back-barrier layer 15, the C and Si concentrations in the back-barrier layer 15 may be higher than those in the lower channel layer 16a.

The wafer 10 and the method of manufacturing the semiconductor device 20 and the wafer 10, according to Embodiment 4 of the present disclosure are constituted and implemented as described above; hence, the following effects are brought about. The back-barrier layer 15, since it is formed at a lower temperature, has a higher C concentration. Consequently, the C traps electrons in the 2DEG, and current collapse is thereby likely to occur. Moreover, occurrence of current collapse deteriorates the transient response characteristic. Since Si is contained also in the back-barrier layer 15 of the wafer 10 and the semiconductor device 20 according to Embodiment 4 of the present disclosure, the Si compensates the C, thus being able to suppress occurrence of current collapse and degradation of the transient response characteristic due to the C in the back-barrier layer 15. Moreover, occurrence of current collapse and degradation of the transient response characteristic can be suppressed more reliably than the case of doping Si into the lower channel layer 16a in Embodiment 1.

While the growth condition for the back-barrier layer 15 deteriorates the flatness because of the low temperature, the high pressure, and the high V/III ratio, the flatness is not pronouncedly deteriorated because the In in the back-barrier layer has surfactant effect and can increase the surface migration length of Ga. Hence, the flatness can be further improved by forming the back-barrier layer 15 at a low pressure and a low V/III ratio in combination with Embodiment 2 or Embodiment 3.

While Embodiment 4 describes the example that the concentration of Si contained in the back-barrier layer 15 is higher than the concentration of C contained therein, even though the Si concentration is lower than the C concentration, the Si compensates part of the C, thus being able to suppress occurrence of current collapse.

INDUSTRIAL APPLICABILITY

The epitaxial wafer and the semiconductor device and epitaxial wafer manufacturing method in accordance with the present disclosure can be utilized for a high electron mobility transistor and in manufacturing the high electron mobility transistor.

REFERENCE NUMERALS

10: epitaxial wafer (wafer);
12: substrate;
13: nucleation layer;
14: buffer layer;
15: back-barrier layer;
16a: lower channel layer;
16b: upper channel layer;
17: electron-supply layer;
20: semiconductor device;
21: source electrode;
22: drain electrode; and
23: gate electrode.

The invention claimed is:

1. An epitaxial wafer comprising:
a substrate;
a buffer layer formed of a crystal having a composition formula represented by $Al_xGa_yIn_zN$ (x+y+z=1, y>0) on the substrate;
a back-barrier layer formed of a crystal having a composition formula represented by $Al_xGa_yIn_zN$ (x+y+z=1, y>0, z>0) on the buffer layer;
a channel layer formed of a crystal having a composition formula represented by $Al_xGa_yIn_zN$ (x+y+z=1, y>0) on the back-barrier layer; and
an electron-supply layer formed of a crystal having a composition formula represented by $Al_xGa_yIn_zN$ (x+y+z=1, x>0) on the channel layer,
wherein the channel layer is constituted with an upper channel layer underneath the electron-supply layer and a lower channel layer on the back-barrier layer,
the lower channel layer has a C concentration higher than the upper channel layer and contains Si, and an Si concentration in the lower channel layer is higher than the C concentration in the lower channel layer.

2. The epitaxial wafer of claim 1, wherein the back-barrier layer contains Si.

3. The epitaxial wafer of claim 1, wherein a layer thickness from an interface between the channel layer and the back-barrier layer to an interface between the channel layer and the electron-supply layer is 100 nm or less.

4. The epitaxial wafer of claim 1, wherein the buffer layer is formed of a crystal having a composition formula represented by GaN, the back-barrier layer is formed of a crystal having a composition formula represented by $Ga_yIn_zN$ (y+z=1, y>0, z>0), and the channel layer is formed of a crystal having a composition formula represented by GaN.

5. A semiconductor device comprising:
an epitaxial wafer of claim 1;
a source electrode and a drain electrode formed on the electron-supply layer in the epitaxial wafer with a space in between; and
a gate electrode formed between the source electrode and the drain electrode on the electron-supply layer.

6. An epitaxial wafer comprising:
a substrate;
a buffer layer formed of a crystal having a composition formula represented by $Al_xGa_yIn_zN$ (x+y+z=1, y>0) on the substrate;
a back-barrier layer formed of a crystal having a composition formula represented by $Al_xGa_yIn_zN$ (x+y+z=1, y>0, z>0) on the buffer layer;
a channel layer formed of a crystal having a composition formula represented by $Al_xGa_yIn_zN$ (x+y+z=1, y>0) on the back-barrier layer; and
an electron-supply layer formed of a crystal having a composition formula represented by $Al_xGa_yIn_zN$ (x+y+z=1, x>0) on the channel layer, wherein the channel layer is constituted with an upper channel layer underneath the electron-supply layer and a lower channel layer on the back-barrier layer, the lower channel layer has a C concentration higher than the upper channel layer and contains Si, and the back-barrier layer contains Si and C, and an Si concentration in the back-barrier layer is higher than a C concentration in the back-barrier layer.

7. The epitaxial wafer of claim 6, wherein a layer thickness from an interface between the channel layer and the back-barrier layer to an interface between the channel layer and the electron-supply layer is 100 nm or less.

8. The epitaxial wafer of claim 6, wherein the buffer layer is formed of a crystal having a composition formula represented by GaN, the back-barrier layer is formed of a crystal having a composition formula represented by $Ga_yIn_zN$ (y+z=1, y>0, z>0), and the channel layer is formed of a crystal having a composition formula represented by GaN.

9. A semiconductor device comprising:
an epitaxial wafer of claim 6;
a source electrode and a drain electrode formed on the electron-supply layer in the epitaxial wafer with a space in between; and
a gate electrode formed between the source electrode and the drain electrode on the electron-supply layer.

10. An epitaxial wafer manufacturing method comprising:
a placing step of placing a substrate in a furnace;
a buffer layer forming step of growing on the substrate a buffer layer formed of a crystal having a composition formula represented by $Al_xGa_yIn_zN$ (x+y+z=1, y>0);
a back-barrier layer forming step of growing on the buffer layer a back-barrier layer formed of a crystal having a composition formula represented by $Al_xGa_yIn_zN$ (x+y+z=1, y>0, z>0);
a channel layer forming step of growing on the back-barrier layer a channel layer formed of a crystal having a composition formula represented by $Al_xGa_yIn_zN$ (x+y+z=1, y>0); and
an electron-supply layer forming step of growing on the channel layer an electron-supply layer formed of a crystal having a composition formula represented by $Al_xGa_yIn_zN$ (x+y+z=1, x>0),
wherein in the channel layer forming step, a temperature in the furnace when forming on the back-barrier layer a lower channel layer of the channel layer is set lower than a temperature in the furnace when forming underneath the electron-supply layer an upper channel layer of the channel layer, and
wherein in the channel layer forming step, the lower channel layer is doped with Si so that an Si concentration in the lower channel layer is higher than a C concentration in the lower channel layer when forming the lower channel layer.

11. The epitaxial wafer manufacturing method of claim 10, wherein in the channel layer forming step, a pressure in the furnace when forming the lower channel layer is set lower than a pressure in the furnace when forming the upper channel layer.

12. The epitaxial wafer manufacturing method of claim 10, wherein in the channel layer forming step, a V/III ratio, which is a value of a molar flow rate of a group-V material fed into the furnace divided by a molar flow rate of a group-III material fed into the furnace, when forming the lower channel layer is lower than a V/III ratio when forming the upper channel layer.

13. The epitaxial wafer manufacturing method of claim 10, wherein in the back-barrier layer forming step, the back-barrier layer is doped with Si when forming the back-barrier layer.

14. The epitaxial wafer manufacturing method of claim 13, wherein in the back-barrier layer forming step, the back-barrier layer is doped with Si so that an Si concentration in the lower channel layer is higher than a C concentration in the lower channel layer when forming the lower channel layer.

15. The epitaxial wafer manufacturing method of claim 10, wherein the buffer layer is formed of a crystal having a composition formula represented by GaN, the back-barrier layer is formed of a crystal having a composition formula represented by $Ga_y In_z N$ (y+z=1, y>0, z>0), the channel layer is formed of a crystal having a composition formula represented by GaN; and the electron-supply layer is formed of a crystal having a composition formula represented by $Al_x Ga_y In_z N$ (x+y+z=1, x>0, y>0).

\* \* \* \* \*